(12) United States Patent
Al Ahmad et al.

(10) Patent No.: US 12,726,050 B2
(45) Date of Patent: Sep. 1, 2026

(54) METHOD AND SYSTEM FOR WIRELESS ENERGY HARVESTING AND POWER MANAGEMENT USING PIEZOELECTRIC COMPONENTS

(71) Applicant: United Arab Emirates University, Al Ain (AE)

(72) Inventors: Mahmoud F. Y. Al Ahmad, Al Ain (AE); Abdulrahman Dahir Saeed Mohamed, Al Ain (AE)

(73) Assignee: United Arab Emirates University, Al Ain (AE)

( * ) Notice: Subject to any disclaimer, the term of this patent is extended or adjusted under 35 U.S.C. 154(b) by 0 days.

(21) Appl. No.: 19/426,963

(22) Filed: Dec. 19, 2025

(65) Prior Publication Data

US 2026/0128618 A1 May 7, 2026

Related U.S. Application Data

(62) Division of application No. 18/826,904, filed on Sep. 6, 2024, now Pat. No. 12,531,437.

(51) Int. Cl.

| | |
|---|---|
| ***H02J 50/20*** | (2016.01) |
| ***H02J 50/00*** | (2016.01) |
| ***H02M 1/42*** | (2007.01) |
| ***H10N 30/40*** | (2023.01) |

(52) U.S. Cl.

CPC ............ *H02J 50/20* (2016.02); *H02J 50/001* (2020.01); *H02M 1/4241* (2013.01); *H10N 30/40* (2023.02)

(58) Field of Classification Search

CPC ...... H02J 50/20; H02J 50/001; H02M 1/4241; H10N 30/40

See application file for complete search history.

(56) References Cited

U.S. PATENT DOCUMENTS 4,846,178 A * 7/1989 Fuxue ...................... A61N 1/40 607/2
5,329,200 A 7/1994 Zaitsu
(Continued)

FOREIGN PATENT DOCUMENTS

CN 109713770 5/2019
EP 1691426 8/2006
(Continued)

OTHER PUBLICATIONS

Office Action Summary (Examination Report), United Arab Emirates Ministry of Economy, Oct. 25, 2025.

*Primary Examiner* — Rexford N Barnie
*Assistant Examiner* — Rasem Mourad
(74) *Attorney, Agent, or Firm* — Boyle Fredrickson S.C.

(57) ABSTRACT

The present invention relates to a radio frequency energy harvester module. The harvester module receives an AC input voltage from a wireless power source, rectifies it into a DC voltage, and uses a piezoelectric transformer to convert this voltage into a transformed AC signal, which is subsequently rectified to generate a stable DC output. The system includes an oscillator to generate excitation or oscillation signals, matched to the resonance frequency of the piezoelectric transformer. The method includes steps for converting wireless power into usable DC output using rectification, piezoelectric transformation, and feedback-based optimization.

7 Claims, 9 Drawing Sheets

(56) References Cited

U.S. PATENT DOCUMENTS

| | | | | |
|---|---|---|---|---|
| 5,814,922 | A * | 9/1998 | Uchino | H10N 30/40 310/366 |
| 5,886,514 | A | 3/1999 | Iguchi | |
| 6,894,616 | B1 * | 5/2005 | Forster | H10N 30/40 330/171 |
| 2007/0200455 | A1 * | 8/2007 | Yamaguchi | H02M 1/44 310/318 |
| 2012/0153773 | A1 | 6/2012 | Sang Kyun Lee | |
| 2014/0361662 | A1 * | 12/2014 | Al Ahmad | H02N 2/181 74/DIG. 9 |
| 2015/0263658 | A1 | 9/2015 | Benya, Jr. | |
| 2019/0172996 | A1 | 6/2019 | Ikeuchi | |
| 2020/0119585 | A1 | 4/2020 | Rodrigues Mansano | |
| 2023/0236232 | A1 * | 7/2023 | Bradley | H02J 50/005 324/119 |

FOREIGN PATENT DOCUMENTS

| | | | |
|---|---|---|---|
| JP | 2018143069 | A | 9/2018 |
| KR | 20090120704 | A | 11/2009 |
| KR | 20240128338 | A | 8/2024 |

* cited by examiner

METHOD AND SYSTEM FOR WIRELESS ENERGY HARVESTING AND POWER MANAGEMENT USING PIEZOELECTRIC COMPONENTS

CROSS-REFERENCE TO RELATED APPLICATIONS

This application is a divisional of and claims priority to U.S. application Ser. No. 18/826,904, filed on Sep. 6, 2024, the entire contents of which are incorporated herein.

TECHNICAL FIELD

The present invention relates to the field of wireless energy harvesting and power management. The invention also includes an optimization circuit for managing power storage and delivery, ensuring stable and adaptive energy supply to external devices. Additionally, it covers methods and systems for integrating the RF energy harvester and optimization circuit into devices that require efficient transition and management between multiple power sources.

BACKGROUND OF THE INVENTION

The present invention relates to the field of energy harvesting and power management, focusing on systems and methods that enable the efficient and sustainable capture, storage, and utilization of energy from ambient radio frequency (RF) sources. Specifically, this invention concerns an RF energy harvesting module, a battery system, and a device that integrates these components to provide a self-sustaining power solution for low-energy electronic devices.

Efficient and sustainable cyclic energy harvesters are designed to continuously convert energy from renewable environmental sources into usable electrical power. These systems capture ambient energy from sources such as solar radiation, wind, thermal gradients, or mechanical vibrations and convert it into electrical energy suitable for powering various electronic devices. The cyclic nature of these harvesters ensures consistent operation over extended periods, making them highly suitable for applications such as sensors, wearable electronics, and remote monitoring systems.

One of the primary objectives of these energy harvesters is to maximize energy conversion efficiency while minimizing energy losses. This is often achieved through the use of advanced materials and technologies, such as thermoelectric or photovoltaic materials, which are capable of efficiently transforming energy from one form to another. Additionally, these systems are typically integrated with energy storage solutions, such as supercapacitors or batteries, to store the harvested energy and provide a stable power supply, even when the ambient energy source is intermittent.

In the realm of prior art, EP1691426A2 discloses a piezoelectric tag that utilizes a piezoelectric transformer to enhance the voltage of a received RF signal. This system comprises a dipole antenna for receiving RF signals, a rectification circuit for initial signal processing, and a piezoelectric transformer that magnifies the received signal's voltage. The amplified signal is then further rectified and used to power a transponder circuit, showcasing the application of piezoelectric technology in RF energy harvesting and power conversion.

Additionally, US2014361662A1 describes an apparatus for energy conversion that integrates a piezoelectric component capable of converting vibrational energy into electrical energy. The system manages the generated electrical energy by splitting it between powering an electronic device and driving an oscillator, which, in turn, excites the piezoelectric component. This feedback loop enhances the vibrational input, thereby increasing the efficiency of energy conversion. The AC output from the piezoelectric component is rectified and stored in an energy storage unit, ensuring regulated power distribution.

The development of efficient and sustainable cyclic energy harvesters is driven by the growing need for renewable energy solutions and the increasing demand for autonomous, self-powered devices across various sectors, including environmental monitoring, medical devices, and the Internet of Things (IoT). By harnessing renewable energy sources and ensuring a continuous energy supply, these systems contribute to reducing reliance on traditional fossil fuels and promoting environmental sustainability.

The present invention addresses these needs by providing a novel RF energy harvesting module capable of efficiently capturing and converting ambient RF energy, a battery system that utilizes an oscillator and a piezoelectric transformer for effective power conversion and storage, and an integrated device that ensures reliable, long-term operation without reliance on external power sources. This innovative approach not only enhances the efficiency of energy harvesting but also supports the development of sustainable, self-sustaining electronic devices.

SUMMARY OF THE INVENTION

In a first aspect of the present invention there is proposed a radio frequency energy harvester module comprising the following:

- a first rectifying circuit operable to receive an AC input voltage and to generate a DC input voltage from a received AC input voltage;
- a DC to AC converter operable to generate an excitation voltage from the DC input voltage generated by the first rectifying circuit;
- a piezoelectric transformer operable to generate a transformed AC voltage from the excitation voltage generated by the DC to AC converter; and,
- a second rectifying circuit operable to generate a DC output voltage from the second AC voltage generated by the piezoelectric transformer.

In some configurations according to the first aspect, the DC to AC converter generates a sinusoidal drive signal, which is specifically intended for driving the piezoelectric transformer. In other words, the excitation voltage may be a sinusoidal drive signal. The sinusoidal nature of the signal may be adapted to ensure optimal operation of the piezoelectric transformer, enhancing its performance in generating the desired output voltage. Preferably, the DC to AC converter generates a sinusoidal drive signal at the piezoelectric transformer resonant frequency, most preferably at a controlled amplitude avoiding excess strain on piezoelectric material in the piezoelectric transformer. It should be noted that the frequency of the antenna receiving the wireless power electromagnetic signal can differ from the frequency of the excitation voltage generated by the DC to AC converter.

In a second aspect of the present invention there is proposed another variation of a radio frequency energy harvester module. This module comprises:

- a first rectifying circuit operable to receive an AC input voltage and to generate a biasing signal from a received AC input voltage;

a oscillator operable to generate an oscillation signal from the biasing signal generated by the first rectifying circuit;

a piezoelectric transformer operable to generate a transformed AC voltage from the oscillation signal generated by the oscillator; and, a second rectifying circuit operable to generate a DC output voltage from the transformed AC voltage generated by the piezoelectric transformer.

In embodiments according to the first and/or second aspect, the radio frequency energy harvester module comprises a wireless power receiving circuit operable to generate the AC input voltage from a wireless power electromagnetic signal. In variations of this embodiment the wireless power receiving circuit generates the AC input voltage from the wireless power electromagnetic signal using an antenna, such as a dipole, patch or coil antenna. In further embodiment the circuit comprises the antenna and an impedance matching circuit operable to match the impedance of AC voltage generated from the antenna to the impedance presented by the first rectifying unit.

The piezoelectric transformer within the module is in embodiments configured to produce an amplified and/or inverted AC voltage. This capability allows the module to adapt the power signal for various applications, depending on the requirements of the connected load or system.

In embodiments according to the second aspect both the oscillator and the piezoelectric transformer are configured to operate at a matching resonance frequency. Preferably, this matching resonance frequency corresponds to the natural frequency of vibration of the piezoelectric material within the piezoelectric transformer, ensuring maximum energy transfer and efficiency.

Additionally, in some embodiments, the frequency generated by the oscillator may be adjustable. This adjustability allows for fine-tuning of the oscillator's frequency to precisely match the resonance frequency of the piezoelectric transformer, thereby optimizing the module's performance under varying operating conditions.

It should be understood that the frequency of the antenna receiving the wireless power electromagnetic signal and the frequency of the oscillator may be different to each other due to their differing functional roles within the system. The antenna frequency is primarily dictated by the physical characteristics of the antenna, enabling efficient reception of electromagnetic waves at a designated frequency or frequency range. Conversely, the oscillator frequency preferably match the resonant frequency of the piezoelectric transformer. This is preferred because the piezoelectric transformer operates most efficiently at its resonant frequency, ensuring effective energy conversion from the electrical domain to the mechanical domain and back. Thus, while the antenna and oscillator frequencies may vary independently, the oscillator frequency and the piezoelectric transformer frequency must be aligned to maintain optimal system functionality.

In a third aspect of the present invention a method for power conversion using a DC to AC converter is disclosed. The proposed method comprises the steps:

receiving an AC input voltage generated from a wireless power electromagnetic signal;

rectifying the AC input voltage to produce a DC input voltage;

converting the DC input voltage to an excitation signal using a DC to AC converter;

transforming the excitation voltage to produce a transformed AC voltage using a piezoelectric transformer;

rectifying the transformed AC voltage to produce a DC output voltage.

In a fourth aspect of the present invention a method for power conversion using a oscillator is disclosed. The proposed method comprises the steps:

receiving a AC input voltage generated from a wireless power electromagnetic signal;

rectifying the AC input voltage to produce a biasing signal;

converting the biasing signal to produce a oscillation signal using a oscillator;

transforming the oscillation signal to produce a transformed AC voltage using a piezoelectric transformer;

rectifying the transformed AC voltage to produce a DC output voltage.

In embodiments according to the fourth and fifth aspect of the present invention the AC input voltage is generated using an antenna. Preferably, the AC input voltage is generated using the wireless power receiving circuit according to embodiments of the first or second aspect of the present invention.

In a fifth aspect of the present invention there is proposed an optimization circuit for an energy reservoir that integrates various components to manage stored electrical energy efficiently. The optimization circuit for a power reservoir comprises:

an oscillator operable to generate an oscillation signal from a received biasing signal;

a piezoelectric transformer operable to generate a transformed AC signal from the oscillation signal generated by the oscillator;

an AC to DC converter operable to generate a DC storage voltage from the transformed AC voltage generated by the piezoelectric transformer, and output the DC storage voltage to the energy reservoir;

a power management module operable to receive a DC reservoir voltage from the energy reservoir and output both the biasing signal and a DC output voltage.

The output DC voltage may then power an application circuit, i.e., a any suitable electrical load. The application circuit may be any circuit suitable for being powered by the energy reservoir.

In embodiments of the optimization circuit of the fifth aspect, the oscillator is operable to generate the oscillation signal with a frequency matching the resonance frequency of the piezoelectric transformer.

In further aspects there is proposed a method for managing power in a power reservoir, the method comprising:

receiving a biasing signal from the power reservoir;

generating an oscillation signal from the biasing signal using an oscillator;

generating a transformed AC signal from the oscillation signal using a piezoelectric transformer;

converting the transformed AC signal into a DC storage voltage using an AC to DC converter and outputting the DC storage voltage to an energy reservoir module;

receiving a DC reservoir voltage from the energy reservoir module using a power management module;

outputting both the biasing signal and a DC output voltage from the power management module.

In embodiments according to this method it may perform any of the operations of the fifth aspect.

In a sixth aspect, a device is disclosed that incorporates both the radio frequency energy harvester module of the first aspect or second aspect—and the optimization circuit of the fifth aspect of the present invention. The radio frequency energy harvester module is operably coupled to supply a first device voltage, while the optimization circuit is operably coupled to supply a second device voltage. This configuration allows the device to harness energy from wireless power signals and output the energy to an energy reservoir as to store it for future use.

In a preferred embodiment of the sixth aspect, the power management module is operable to transition the device between being powered by the first device voltage from the radio frequency energy harvester module and the second device voltage, depending on the availability of the wireless power signal or the state of the energy reservoir.

Additionally, the device may comprise a communication module that is operably coupled to the radio frequency energy harvester module. This communication module is configured to derive information from the wireless power electromagnetic signal. The communication module may also be designed to store and/or transmit this information, enabling the device to perform data communication tasks in addition to its energy harvesting and storage functions.

BRIEF DESCRIPTION OF THE DRAWINGS

The drawings illustrate various embodiments of the present invention. These embodiments are provided to exemplify different aspects and aid in understanding the invention. It should be understood that, while the invention has been illustrated and described in accordance with preferred embodiments, variations and modifications may be made without departing from the scope of the invention as defined by the claims.

DETAILED DESCRIPTION OF PREFERRED EMBODIMENTS

Figure 1:
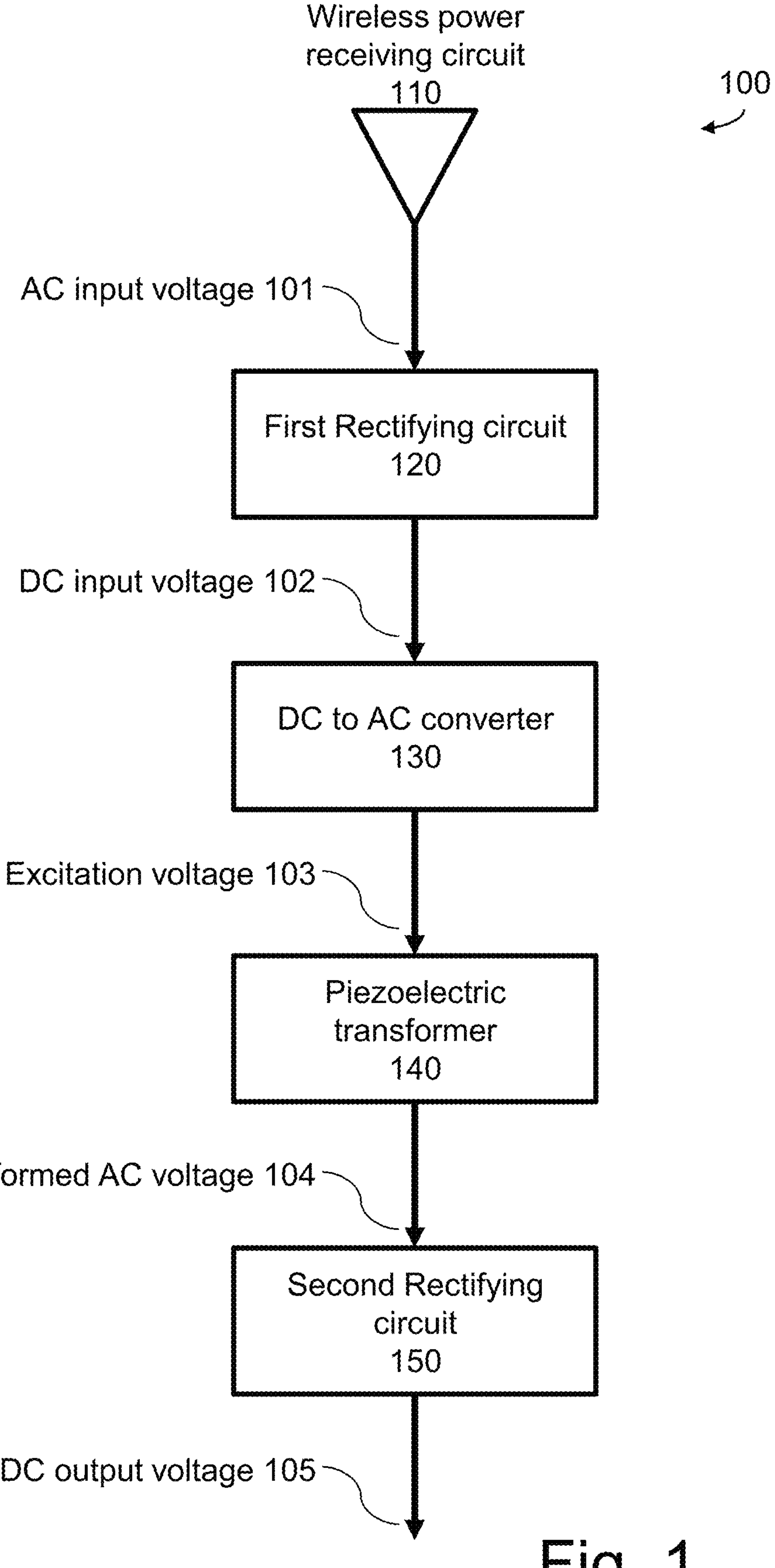
FIG. 1 shows a radio frequency energy harvester module with a wireless power receiving circuit and a DC to AC converter, according to the first aspect.

Illustrated in FIG. 1 is a preferred embodiment according to the first aspect of the present invention. In this illustrated embodiment there is proposed a radio frequency energy harvester module 100 which comprises:

- a wireless power receiving circuit 110 operable to generate an AC input voltage 101 from a wireless power electromagnetic signal using a antenna;
- a first rectifying circuit 120 operable to receive an AC input voltage 101 and to generate a DC input voltage 102 from the received AC input voltage 101;
- a DC to AC converter 130 operable to generate an excitation voltage 103 from the DC input voltage 102 generated by the first rectifying circuit 120;
- a piezoelectric transformer 140 operable to generate a transformed AC voltage 104 from the excitation voltage 103 generated by the DC to AC converter 130; and,
- a second rectifying circuit 150 operable to generate a DC output voltage 105 from the transformed AC voltage 104 generated by the piezoelectric transformer 140.

In some configurations according to the first aspect, the DC to AC converter 130 generates a sinusoidal drive signal, which is specifically intended for driving the piezoelectric transformer 140. In other words, the excitation voltage 103 may be a sinusoidal drive signal. The sinusoidal nature of the signal may be adapted to ensure optimal operation of the piezoelectric transformer 140, enhancing its performance in generating the desired output voltage. Preferably, the DC to AC converter 130 generates a sinusoidal drive signal at the piezoelectric transformer resonant frequency, most preferably at a controlled amplitude avoiding excess strain on piezoelectric material in the piezoelectric transformer 140. It should be noted that the frequency of the antenna receiving the wireless power electromagnetic signal can differ from the frequency of the excitation voltage 103 generated by the DC to AC converter 150.

Figure 2:
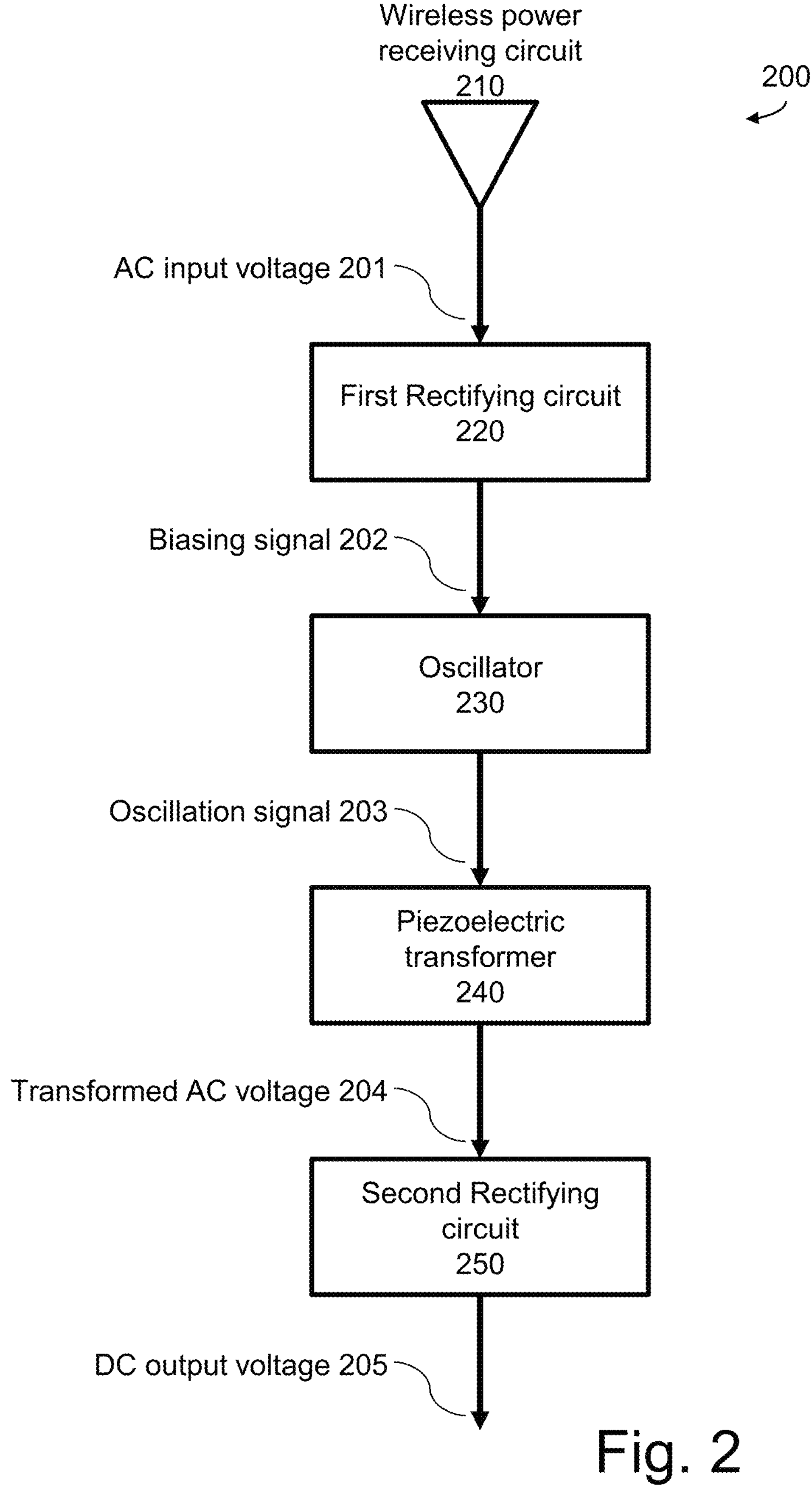
FIG. 2 depicts a embodiment of the second aspect with a wireless power receiving circuit and an oscillator.

Illustrated in FIG. 2 is a preferred embodiment according to the second aspect of the present invention. In this illustrated embodiment there is proposed a radio frequency energy harvester module 200 which comprises:

- a wireless power receiving circuit 220 operable to generate an AC input voltage 101 from a wireless power electromagnetic signal using a antenna;
- a first rectifying circuit 220 operable to receive an AC input voltage 201 and to generate a biasing signal 202 from the received AC input voltage 201;
- a oscillator 230 operable to generate an oscillation signal 203 from the biasing signal 202 generated by the first rectifying circuit 220;
- a piezoelectric transformer 240 operable to generate transformed AC voltage 204 from the oscillation signal 203 generated by the oscillator 230; and,
- a second rectifying circuit 250 operable to generate a DC output voltage 205 from the transformed AC voltage 204 generated by the piezoelectric transformer 240.

In the illustrated embodiments according to the first and/or second aspect, the radio frequency energy harvester module 100, 200 comprises a wireless power receiving circuit 110, 210 operable to generate an AC input voltage 101, 201 from a wireless power electromagnetic signal. In variations of this embodiment the wireless power receiving circuit 110, 210 generates the AC input voltage 101, 201 from the wireless power electromagnetic signal using an antenna, such as a dipole, patch or coil antenna. In further embodiment the circuit 110, 210 comprises the antenna and an impedance matching circuit operable to match the impedance of AC voltage generated from the antenna to the impedance presented by the first rectifying unit 120, 220. In embodiments not illustrated the radio frequency energy harvester module 100, 200 may be configured to receive a AC input voltage 101, 201 generated from a electromagnetic signal, but not comprise the antenna responsible to generating said AC input voltage 101, 201.

The piezoelectric transformer 140, 240 within the module is in embodiments configured to produce an amplified and/or inverted AC voltage. This capability allows the module to adapt the power signal for various applications, depending on the requirements of the connected load or system.

In embodiments according to the second aspect both the oscillator 230 and the piezoelectric transformer 240 are configured to operate at a matching resonance frequency.

Preferably, this matching resonance frequency corresponds to the natural frequency of vibration of the piezoelectric material within the piezoelectric transformer 240, ensuring maximum energy transfer and efficiency.

It should be understood that the frequency of the antenna receiving the wireless power electromagnetic signal and the frequency of the oscillator 230 may be different to each other due to their differing functional roles within the system. The antenna frequency is primarily dictated by the physical characteristics of the antenna, enabling efficient reception of electromagnetic waves at a designated frequency or frequency range. Conversely, the oscillator 230 frequency preferably match the resonant frequency of the piezoelectric transformer 240. This is preferred because the piezoelectric transformer 240 operates most efficiently at its resonant frequency, ensuring effective energy conversion from the electrical domain to the mechanical domain and back. Thus, while the antenna and oscillator 230 frequencies may vary independently, the oscillator 230 frequency and the piezoelectric transformer 240 frequency must be aligned to maintain optimal system functionality.

Additionally, in some embodiments, the frequency generated by the oscillator 230 may be adjustable. This adjustability allows for fine-tuning of the oscillator's frequency to precisely match the resonance frequency of the piezoelectric transformer 240, thereby optimizing the module's performance under varying operating conditions.

Figure 3:
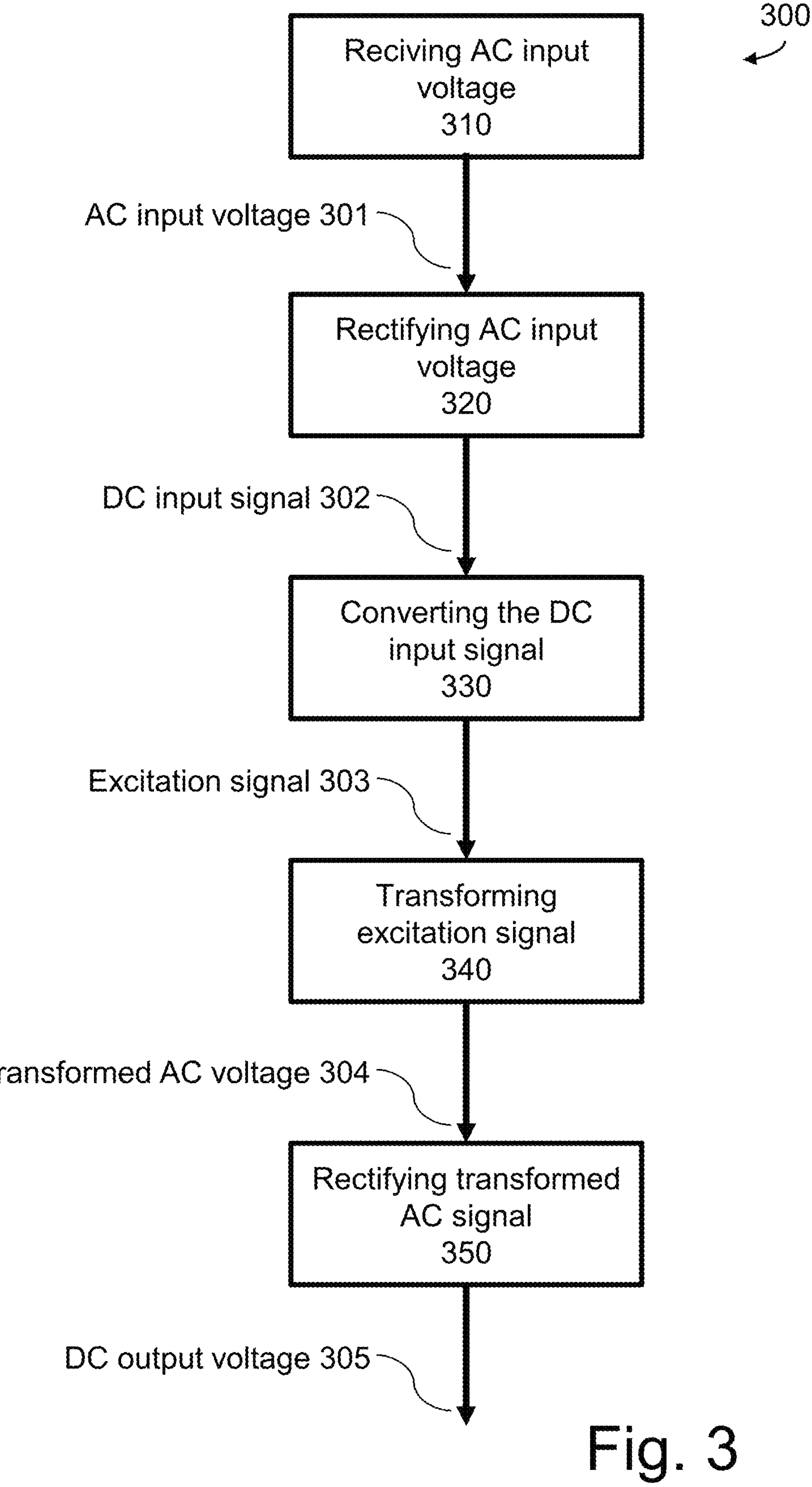
FIG. 3 illustrates a method for power conversion using a DC to AC converter.

FIG. 3 illustrates the third aspect of the present invention relating to a method 300 for power conversion using a DC to AC converter. The proposed method 300 comprises the steps:

- receiving a Ac input voltage 310 generated from a wireless power electromagnetic signal;
- rectifying the AC input voltage 320 to produce a DC input voltage 302;
- converting the DC input voltage 330 to a excitation voltage 303 using a DC to AC converter;
- transforming the excitation voltage 340 to produce a transformed AC voltage 304 using a piezoelectric transformer;
- rectifying the transformed AC voltage 350 to produce a DC output voltage 305.

Figure 4:
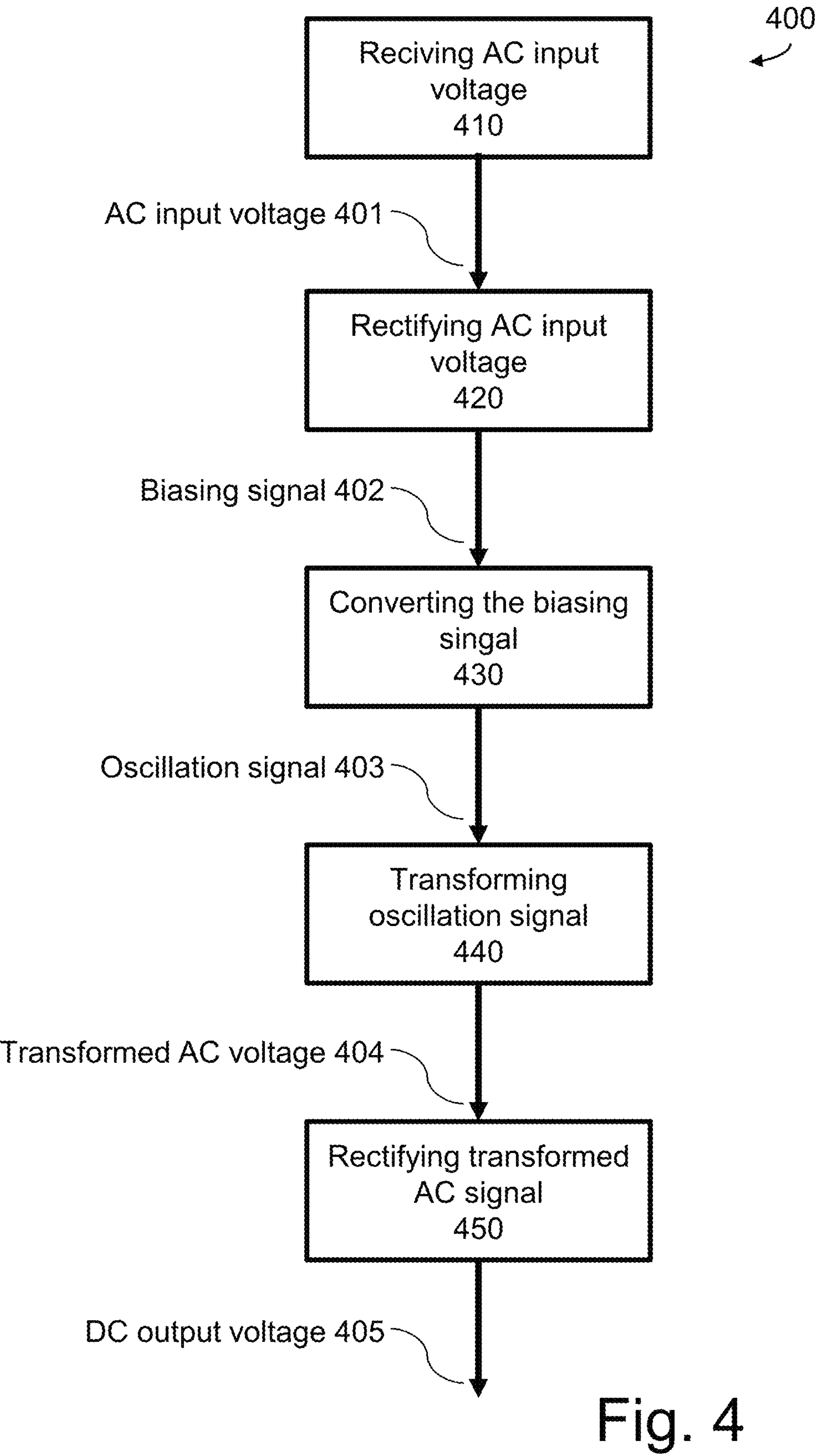
FIG. 4 shows a method for power conversion using an oscillator.

In a fourth aspect, illustrated in FIG. 4, a method 400 for power conversion using a oscillator is disclosed. The proposed method 400 comprises the steps:

- receiving a AC input voltage 410 generated from a wireless power electromagnetic signal;
- rectifying the AC input voltage 420 to produce a biasing signal;
- converting the biasing signal 430 to a oscillation signal 403 using a oscillator;
- transforming the oscillation signal 440 to produce a transformed AC voltage 404 using a piezoelectric transformer;
- rectifying the transformed AC voltage 450 to produce a DC output voltage 405.

In embodiments according to the third and fourth aspect of the present invention the AC input voltage 401 is generated using an antenna. Preferably, the AC input voltage 401 is generated using the wireless power receiving circuit according to embodiments of the first or second aspect of the present invention.

Figure 5:
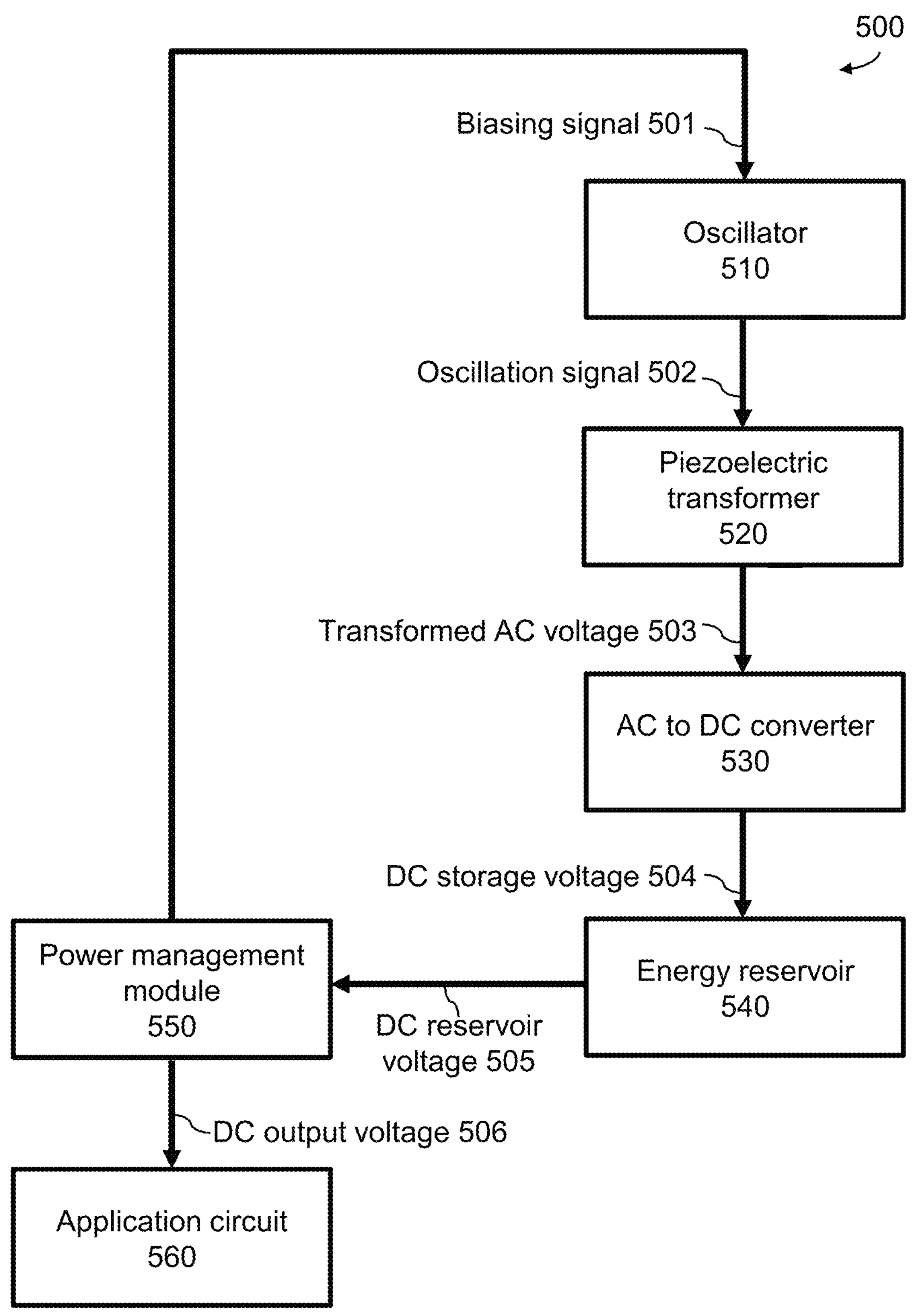
FIG. 5 presents an optimization circuit for an energy reservoir to manage stored energy.

In a embodiment according to the fifth aspect of the present invention, illustrated in FIG. 5, there is proposed an optimization circuit 500 for an energy reservoir 540 that integrates various components to manage stored electrical energy efficiently. The optimization circuit 500 for a power reservoir 540 comprises:

- an oscillator 510 operable to generate an oscillation signal 502 from a received biasing signal 501;
- a piezoelectric transformer 530 operable to generate a transformed AC signal 503 from the oscillation signal 502 generated by the oscillator 510;
- an AC to DC converter 530 operable to generate a DC storage voltage 504 from the transformed AC voltage 503 generated by the piezoelectric transformer 520, and output the DC storage voltage 504 to an energy reservoir 540;
- a power management module 550 operable to receive a DC reservoir voltage 505 from the energy reservoir 540 and output both the biasing signal 501 and a DC output voltage 506.

In the illustrated embodiment the output DC voltage 506 powers an application circuit 560. The application circuit may be any circuit suitable for being powered by the energy reservoir 540.

In embodiments of the optimization circuit 500 of the fifth aspect, the oscillator 510 is operable to generate the oscillation signal 502 with a frequency matching the resonance frequency of the piezoelectric transformer 520.

Figure 6A:
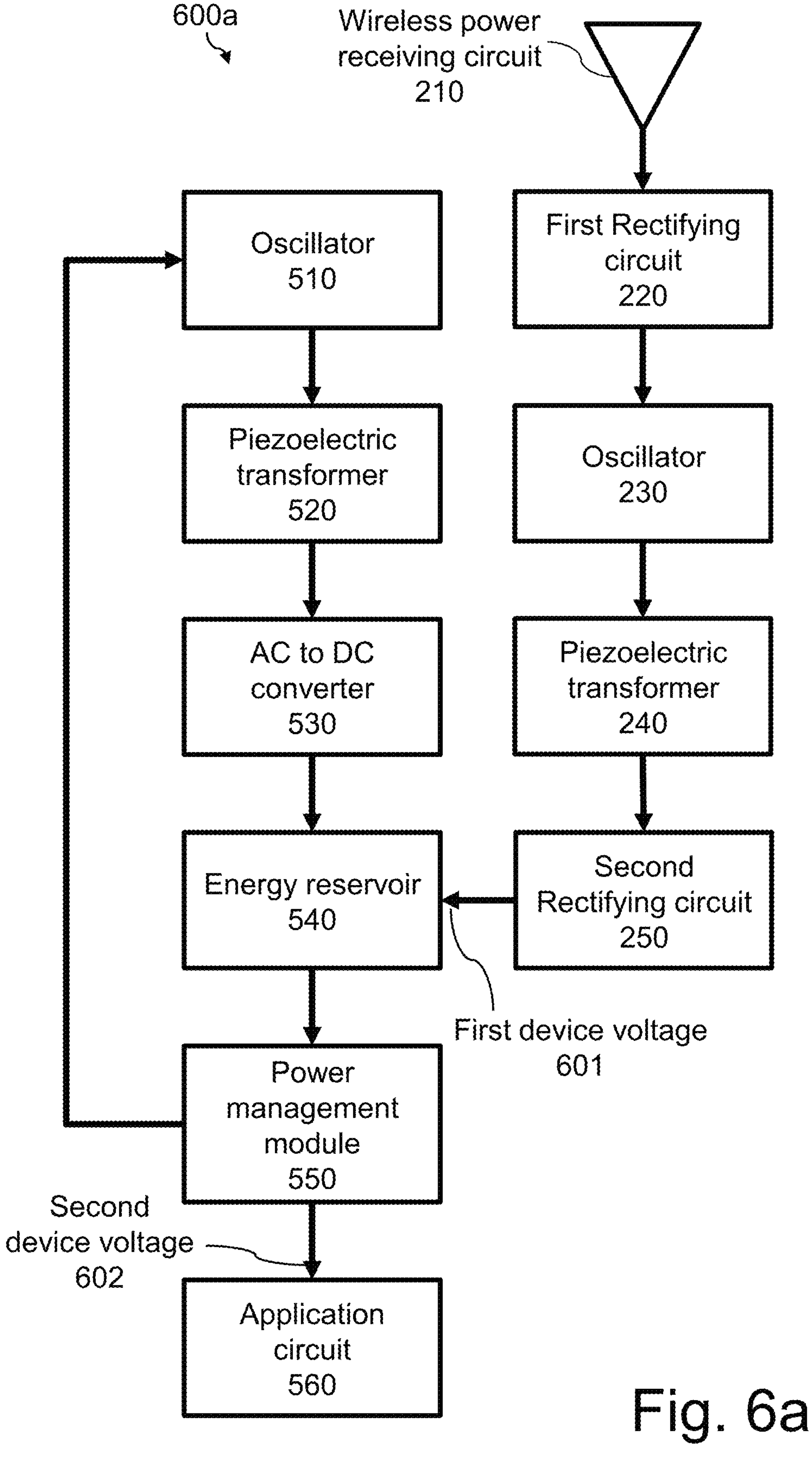
FIG. 6*a*-6*c* illustrates configurations of the sixth aspect combining the radio frequency energy harvester module and optimization circuit for energy reservoir.
Figure 6B:
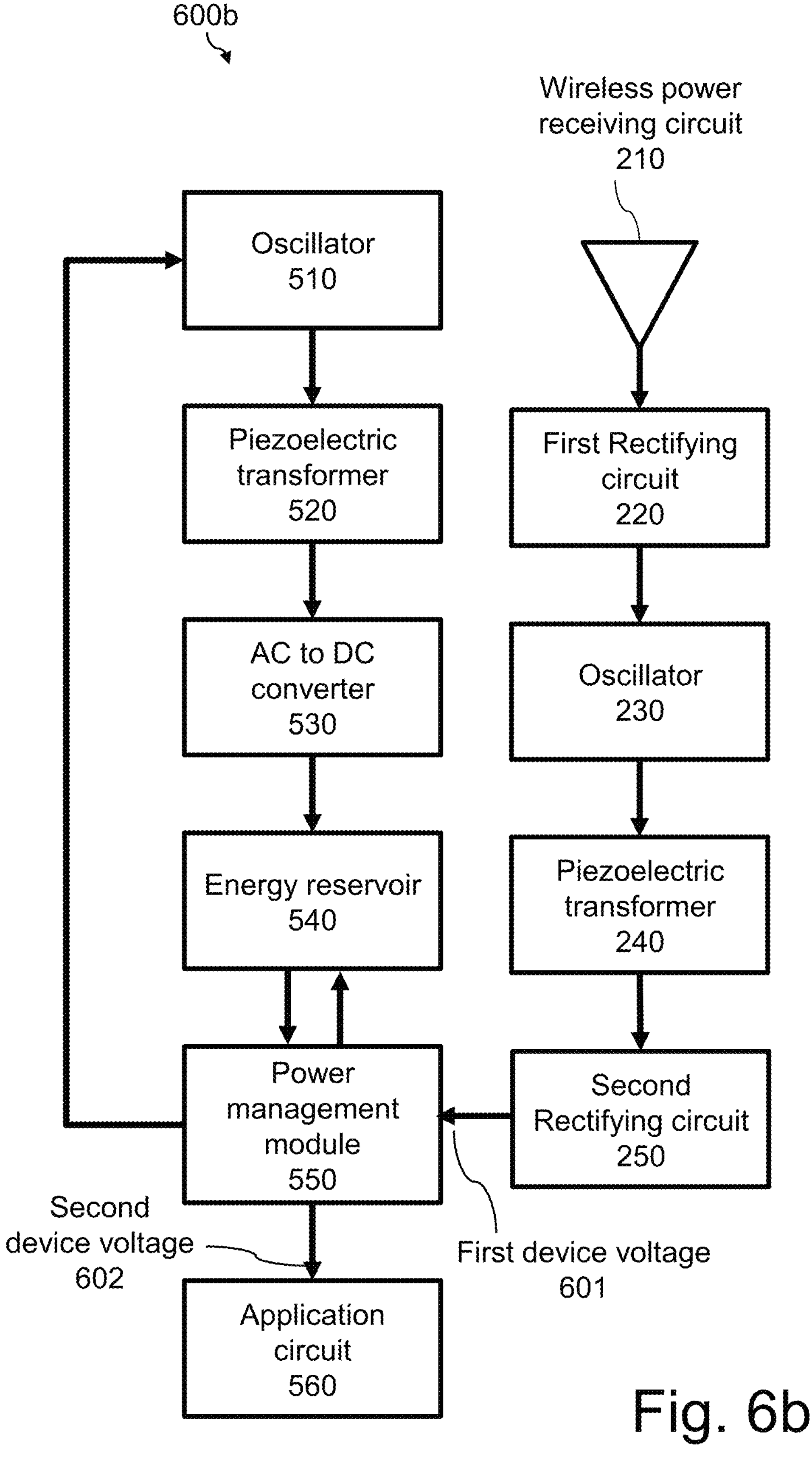
Figure 6C:
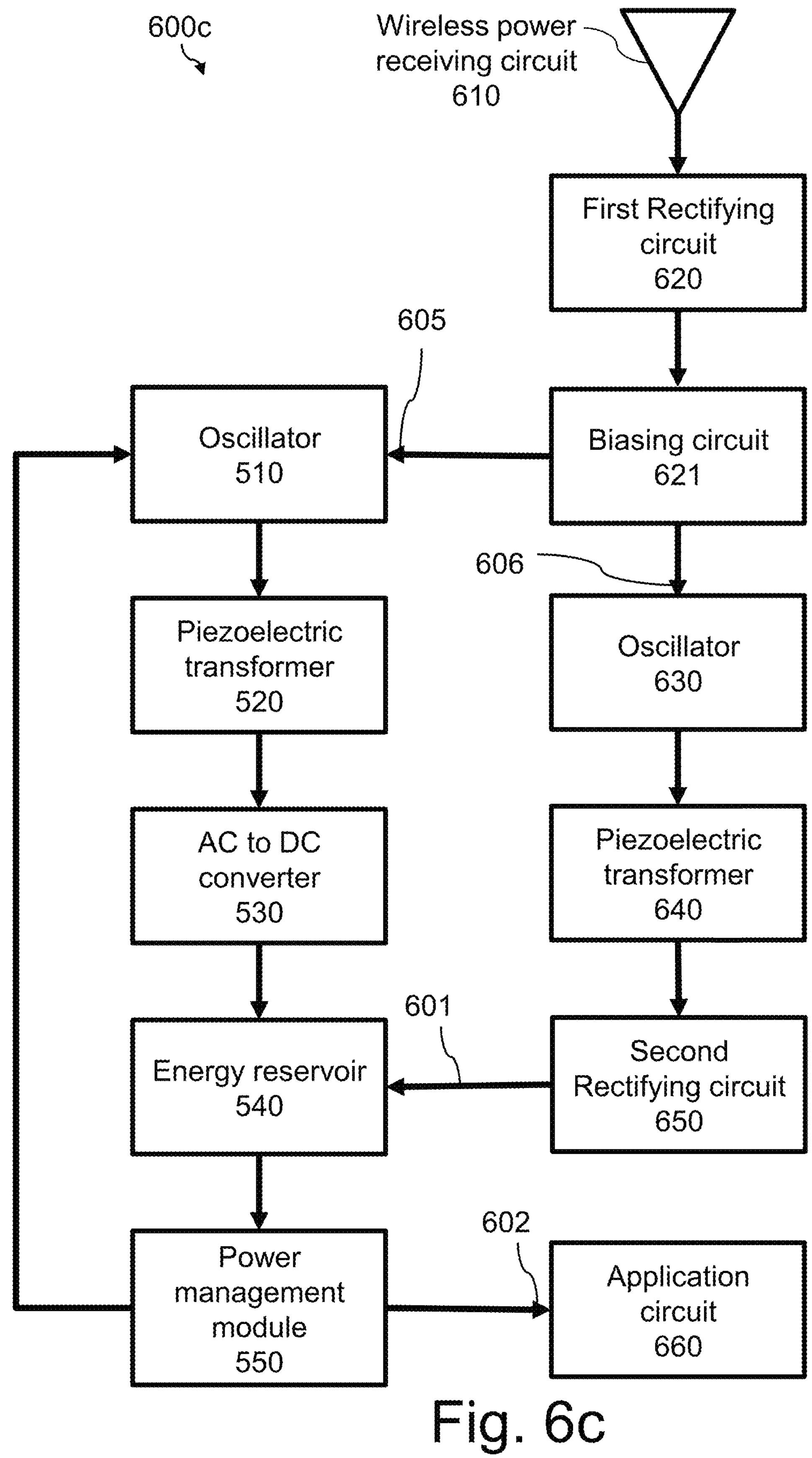

In FIGS. 6*a*, 6*b* and 6*c* illustrate various configuration of the sixth aspect of the present invention. According to the sixth aspect there is disclosed a device 600 that incorporates both the radio frequency energy harvester module 100, 200 of the first aspect or second aspect—and the optimization circuit 500 of the fifth aspect of the present invention. The radio frequency energy harvester module 100, 200 is operably coupled to supply a first device voltage, while the optimization circuit 500 is operably coupled to supply a second device voltage. This configuration allows the device to harness energy from wireless power signals and output the energy to an energy reservoir as to store it for future use.

FIG. 6*a* illustrates an embodiment wherein the first device voltage 601 is directed to the energy reservoir 540, and the second device voltage 602 is directed to the application circuit 560.

The embodiment illustrated in FIG. 6*a* may be preferable in scenarios where simplicity and efficiency are paramount. For applications that require a direct and uninterrupted power supply, this configuration may offer the advantage of minimal power loss by providing a direct connection between the energy reservoir 540 and the application circuit 560. This may be particularly beneficial in systems where the energy harvesting conditions are stable and predictable, allowing the energy reservoir 540 to function effectively as a backup without the need for complex power management. Additionally, the reduced complexity of this design can lead to lower manufacturing costs and higher reliability, making it an ideal choice for applications where immediate response time and cost-effectiveness are critical considerations.

FIG. 6*b* illustrates an embodiment wherein the first device voltage 601 is directed to the power management module 550 and the second device voltage 602 is directed to the application circuit 560. The power management module may then be configured to switch the application circuit from being powered by the energy reservoir 540 or the radio frequency energy harvester module circuit.

The embodiment depicted in FIG. 6*b* may be preferable in situations where energy availability is variable or unpredictable, and where maintaining continuous operation of the application circuit is critical. This configuration may be better suited for systems that need to adapt to fluctuating energy harvesting conditions. By intelligently switching between the energy reservoir 540 and the radio frequency energy harvester module circuit, this design ensures that the application circuit 560 is consistently powered by the most appropriate energy source. This flexibility may enhance the reliability and efficiency of the system, making it particularly suitable for environments where energy harvesting is intermittent or where the application circuit 560 must remain operational over extended periods without interruption. Additionally, this embodiment's ability to optimize energy utilization may extend the operational life of the system, making it a robust solution for complex, energy-sensitive applications.

In FIGS. 6*a* and 6*b* the frequency energy harvester module according to the second aspect is illustrated. However, it is likewise possible to incorporate the frequency energy harvester module of the first aspect.

FIG. 6*c* illustrates an embodiment wherein the radio frequency energy harvester module according to the second aspect comprises a biasing circuit 621. The biasing circuit 621 is this embodiment configured to output two biasing signals: a first biasing signal 605 to the oscillator 510 of the optimization circuit; and a second biasing signal 606 to the oscillator 630 of the radio frequency energy harvester module. The biasing circuit 221 may be a standalone circuit as illustrated in FIG. 6*c*, or it could be incorporated within the first rectifying circuit and/or oscillator's 510, 630. For example, in one proposed variation the oscillators 510, 630 are connected to a T-junction coupled to the first rectifying circuit 620. In such a configuration the T-junction could be considered to constitute the biasing circuit 621. As the skilled person understands, in other configurations the biasing circuit 610 might comprise resistors and/or capacitors controlling the voltage and current of the biasing signals 605, 606.

This proposed configuration enables load sharing between the two oscillators 510, 630. By driving both oscillators 510, 630 with biasing signals 605, 606 derived rom the same biasing circuit 621, the embodiment may enable a more balanced current draw between the oscillators 510, 630. This balanced current draw can reduce the overall ripple on the rectifier output, resulting in a smoother DC supply and thereby enhancing the stability of the oscillators 510, 630. This is particularly advantageous in since it facilitates for the subsequent piezoelectric transformers 520, 640 to operate within their optimal range.

The proposed embodiment further enables differential operation of the oscillators. Should the oscillators 510, 630 be configured to operate in a differential mode, where their outputs are compared, the device may benefit from common-mode ripple noise cancellation. This noise cancellation can improve the overall signal integrity and stability of the oscillators 510, 630, which is essential for maintaining consistent performance in environments with fluctuating power levels or electromagnetic interference.

To further optimize the performance of the oscillators 510, 630, it may be beneficial to consider the isolation of the power supplies to the two oscillators 510, 630.

Implementing separate filter networks or even distinct voltage regulators for each oscillator 510, 630 can prevent potential power supply coupling, where fluctuations in one oscillator's power consumption could influence the other. This isolation ensures that each oscillator 510, 630 operates independently, maintaining its intended frequency and stability, and thus contributing to the overall reliability and efficiency of the device 600*c*.

Figure 7:
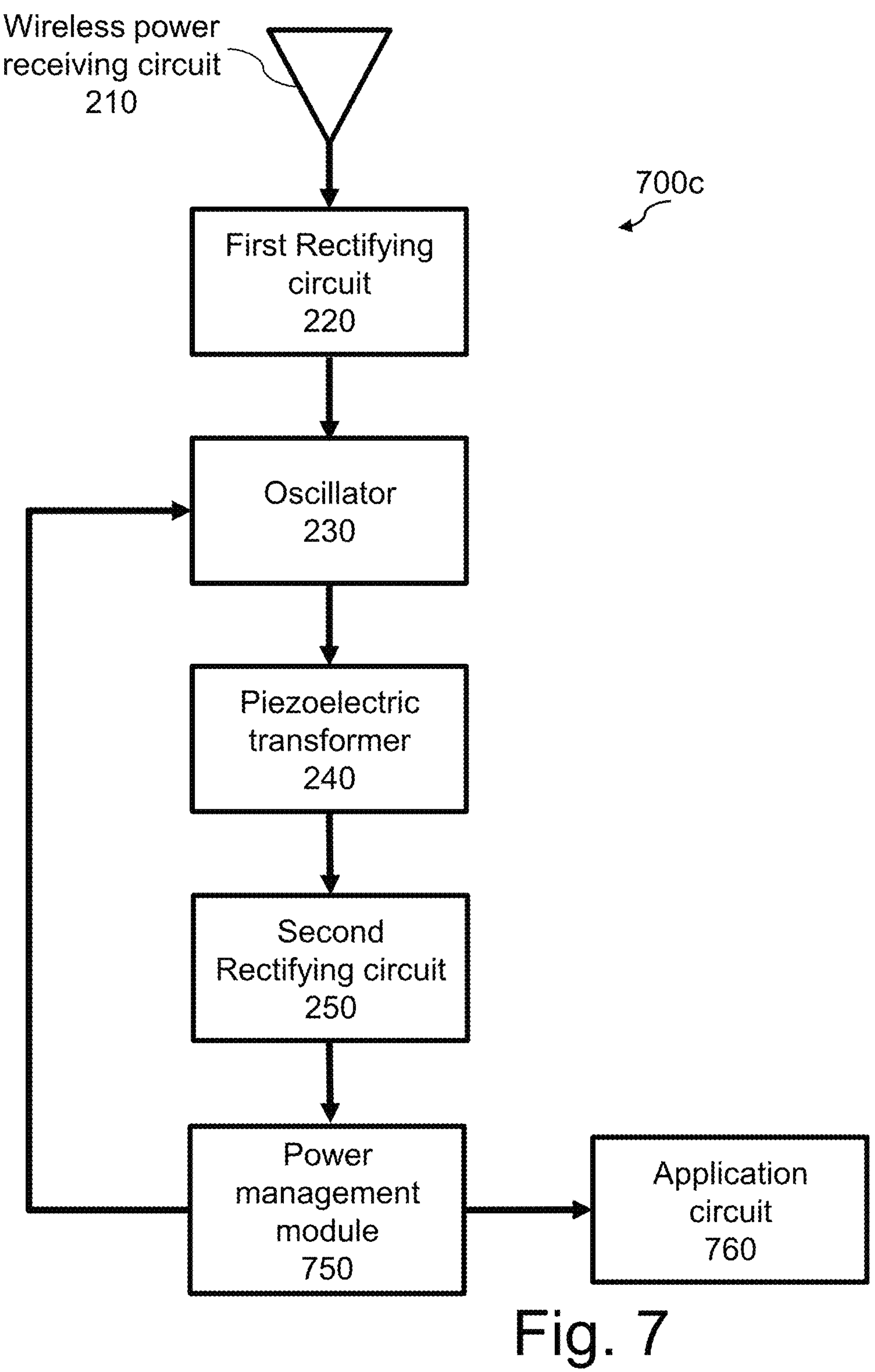
FIG. 7 shows an embodiment according to the second aspect where the second rectifying circuit delivers a DC voltage to a power management module for biasing the oscillator, creating a feedback loop.

FIG. 7 illustrates a embodiment of the second aspect wherein the second rectifying circuit 250 outputs the DC output voltage 205 to a power management module 750, which in turn generates a second biasing signal received by the oscillator 230. This feedback loop may be beneficial in certain scenarios where the load conditions relating to the application circuit 760 and/or the RF signal strength fluctuates. This is because if the RF signal strength fluctuates or the power requirements of the load vary, the power management module 750 can adjust the second biasing signal to optimize the oscillator's 230 performance. By tuning the oscillator 230 in response to feedback, the system can ensure that the piezoelectric transformer 240 operates near its resonant frequency, where it is most efficient. Feedback may also help stabilize the system, ensuring that output voltage to the application circuit 760 remains within a desired range even if input conditions change.

The invention claimed is:

1. A radio frequency energy harvester module comprising:

a first rectifying circuit operable to receive an AC input voltage and to generate a biasing signal from the received AC input voltage;

an oscillator operable to generate an oscillation signal from the biasing signal generated by the first rectifying circuit;

a piezoelectric transformer operable to generate a transformed AC voltage from the oscillation signal generated by the oscillator;

a second rectifying circuit operable to generate a DC output voltage from the transformed AC voltage generated by the piezoelectric transformer; and a power management circuit electrically coupling the second rectifying circuit to the oscillator, the power management circuit being configured to generate, from the DC output voltage, a second biasing signal received by the oscillator in a feedback loop.

2. The radio frequency energy harvester module according to claim 1, wherein the oscillator is operable to generate the oscillation signal with a frequency matching the resonance frequency of the piezoelectric transformer.

3. The radio frequency energy harvester module according to claim 1, wherein the piezoelectric transformer is operable to generate an amplified and inverted AC voltage.

4. The radio frequency energy harvester module according to claim 1, wherein the radio frequency energy harvester module comprises a wireless power receiving circuit operable to generate the AC input voltage from a wireless power electromagnetic signal.

5. The radio frequency energy harvester module according to claim 4, wherein the wireless power receiving circuit comprises an antenna and an impedance matching circuit operable to match the impedance of AC voltage generated from the antenna to the impedance presented by the first rectifying unit.

6. A method for power conversion using an oscillator, the method comprising:

receiving an AC input voltage generated from a wireless power electromagnetic signal;

rectifying the AC input voltage to produce a biasing signal;

converting the biasing signal to an oscillation signal using the oscillator;

generating, from the oscillation signal, a transformed AC voltage using a piezoelectric transformer;

rectifying the transformed AC voltage to produce a DC output voltage; and generating, from the DC output voltage, a second biasing signal received by the oscillator in a feedback loop using a power management circuit.

7. The method according to claim 6, wherein the AC input voltage is generated using the wireless power receiving circuit according to claim 5.

* * * * *